US011601102B2

(12) United States Patent
Tokuya et al.

(10) Patent No.: US 11,601,102 B2
(45) Date of Patent: Mar. 7, 2023

(54) POWER AMPLIFIER CIRCUIT AND SEMICONDUCTOR DEVICE

(71) Applicant: Murata Manufacturing Co., Ltd., Kyoto (JP)

(72) Inventors: Hiroaki Tokuya, Kyoto (JP); Hideyuki Sato, Kyoto (JP); Fumio Harima, Kyoto (JP); Kenichi Shimamoto, Kyoto (JP); Satoshi Tanaka, Kyoto (JP); Takayuki Kawano, Kyoto (JP); Ryoki Shikishima, Kyoto (JP); Atsushi Kurokawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 211 days.

(21) Appl. No.: 17/168,618

(22) Filed: Feb. 5, 2021

(65) Prior Publication Data
US 2021/0242842 A1    Aug. 5, 2021

(30) Foreign Application Priority Data

Feb. 5, 2020  (JP) .............................. JP2020-018150
Aug. 4, 2020  (JP) .............................. JP2020-132359

(51) Int. Cl.
*H03F 1/30* (2006.01)
*H03F 3/24* (2006.01)
(Continued)

(52) U.S. Cl.
CPC ............. *H03F 3/245* (2013.01); *H01L 24/14* (2013.01); *H03F 1/302* (2013.01); *H03F 3/195* (2013.01);
(Continued)

(58) Field of Classification Search
CPC ................ H03F 1/30; H03F 3/20; H03G 3/30
(Continued)

(56) References Cited

U.S. PATENT DOCUMENTS 6,344,775 B1   2/2002  Morizuka et al.
11,469,713 B2 *  10/2022  Shimamoto ........... H03F 1/0261
(Continued)

FOREIGN PATENT DOCUMENTS

JP    2006-270526 A    10/2006
JP    2006-352241 A    12/2006
(Continued)

*Primary Examiner* — Henry Choe
(74) *Attorney, Agent, or Firm* — Pearne & Gordon LLP

(57) ABSTRACT

A power amplifier circuit includes a first transistor disposed on a semiconductor substrate; a second transistor disposed on the semiconductor substrate and configured to supply a bias current based on a first current which is a part of a control current to the first transistor; a third transistor disposed on the semiconductor substrate and having a collector configured to be supplied with a second current which is a part of the control current and an emitter configured to output a third current based on the second current; a first bump electrically connected to an emitter of the first transistor and disposed so as to overlap a first disposition area in which the first transistor is disposed in plan view of the semiconductor substrate; and a second bump disposed so as to overlap a second disposition area in which the third transistor is disposed in the plan view.

20 Claims, 9 Drawing Sheets

(51) Int. Cl.
*H01L 23/00* (2006.01)
*H03F 3/195* (2006.01)

(52) U.S. Cl.
CPC ............... *H01L 2224/1403* (2013.01); *H03F 2200/451* (2013.01)

(58) Field of Classification Search
USPC ................................................. 330/296, 285
See application file for complete search history.

(56) References Cited

U.S. PATENT DOCUMENTS

| | | |
|---|---|---|
| 2005/0218990 A1 | 10/2005 | Makioka |
| 2016/0315060 A1 | 10/2016 | Umemoto et al. |
| 2017/0170789 A1 | 6/2017 | Sasaki |
| 2020/0195210 A1* | 6/2020 | Tanaka ................ H03F 1/302 |
| 2021/0242842 A1* | 8/2021 | Tokuya ................ H01L 24/14 |

FOREIGN PATENT DOCUMENTS

| | | |
|---|---|---|
| JP | 5967317 B2 | 7/2016 |
| WO | 99/29037 A1 | 6/1999 |

\* cited by examiner

POWER AMPLIFIER CIRCUIT AND SEMICONDUCTOR DEVICE

CROSS REFERENCE TO RELATED APPLICATION

This application claims priority from Japanese Patent Application No. 2020-018150 filed on Feb. 5, 2020 and Japanese Patent Application No. 2020-132359 filed on Aug. 4, 2020. The contents of these applications are incorporated herein by reference in its entirety.

BACKGROUND OF THE DISCLOSURE

1. Field of the Disclosure

The present disclosure relates to a power amplifier circuit and a semiconductor device.

2. Description of the Related Art

Power amplifier circuits are used to amplify radio-frequency (RF) signals in mobile communication. A power amplifier circuit is formed as a semiconductor chip and is mounted on a module substrate. When the semiconductor chip of the power amplifier circuit is flip-chip mounted, a stress is applied to a transistor. Regarding a stress applied to a transistor, Japanese Patent No. 5967317 discloses a semiconductor device that reduces a thermal stress resulting from a difference in thermal expansion coefficient between an emitter layer and a pillar bump during operation of the transistor.

BRIEF SUMMARY OF THE DISCLOSURE

A thermal stress applied to a transistor includes a thermal stress resulting from a difference in thermal expansion coefficient between a resin mold covering a flip-chip mounted semiconductor chip and a bump covered with the resin mold.

A material used for the resin mold has a lower thermal expansion coefficient than a metallic material used for the bump. Thus, when an external temperature increases, the degree of thermal expansion is lower in the resin mold than in the bump. The resin mold surrounding the bump suppresses expansion of the bump. On the other hand, the bump thermally expands in accordance with temperature and applies a stress (thermal stress) to the surroundings of the bump.

When a transistor of a power amplifier circuit is disposed so as to be connected to a module substrate, a bump applies a stress to the transistor of the power amplifier circuit in accordance with a variation in external temperature. As a result of a study conducted by the authors, it has been verified that application of a stress to a transistor causes piezoelectric charge to be generated by a piezoelectric effect and causes a base-emitter voltage of the transistor to be changed with favorable reproducibility. The change in the base-emitter voltage is estimated to be caused by generation of piezoelectric charge or the like resulting from the stress. The change in the base-emitter voltage causes a variation in the operation bias point of the transistor and thus affects, for example, the linearity of the power amplifier circuit. As a result, the performance of the power amplifier circuit decreases.

Accordingly, it is an object of the present disclosure to reduce an influence of a thermal stress on a power amplifier circuit.

According to preferred embodiments of the present disclosure, a power amplifier circuit includes a first transistor disposed on a semiconductor substrate; a second transistor disposed on the semiconductor substrate and having a base configured to be supplied with a first current which is a part of a control current, the second transistor being configured to supply a bias current based on the first current to the first transistor; a third transistor disposed on the semiconductor substrate and having a collector configured to be supplied with a second current which is a part of the control current and an emitter configured to output a third current based on the second current; a first metal member electrically connected to an emitter of the first transistor and disposed so as to overlap a first disposition area in which the first transistor is disposed in plan view of the semiconductor substrate; and a second metal member disposed so as to overlap a second disposition area in which the third transistor is disposed in the plan view.

According to other preferred embodiments of the present disclosure, a power amplifier circuit includes a first transistor disposed on a semiconductor substrate; a bias circuit configured to be supplied with a control current and to supply a bias current based on the control current to the first transistor; a first metal member electrically connected to an emitter of the first transistor and disposed so as to overlap a first disposition area in which the first transistor is disposed in plan view of the semiconductor substrate; a control circuit connected to the bias circuit and configured to supply the control current to the bias circuit; a diode disposed on the semiconductor substrate and having an anode connected to the control circuit and a cathode connected to ground; and a third metal member disposed so as to overlap a third disposition area in which the diode is disposed in the plan view. The control circuit is configured to detect a characteristic variation of the diode and supply the control current controlled in accordance with the characteristic variation to the bias circuit.

According to preferred embodiments of the present disclosure, it is possible to reduce an influence of a thermal stress on a power amplifier circuit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
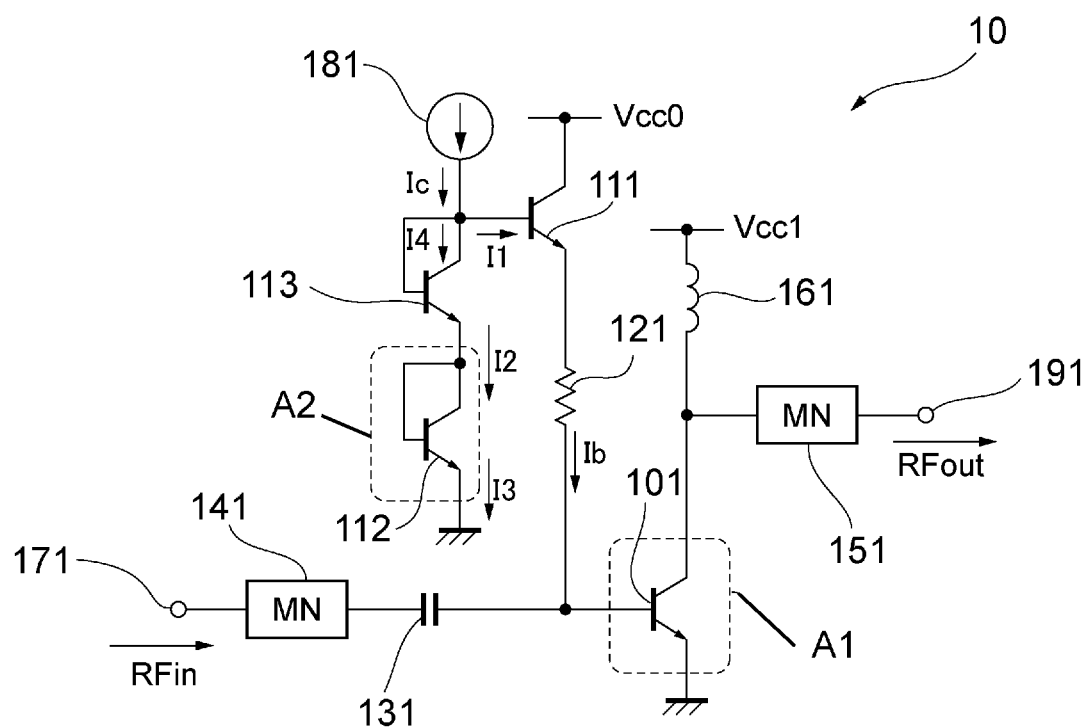
FIG. 1 is a circuit diagram of a power amplifier circuit according to a first embodiment.

Hereinafter, embodiments of the present disclosure will be described in detail with reference to the drawings. The same elements will be denoted by the same reference numerals, and a duplicate description will be omitted as much as possible.

A power amplifier circuit 10 according to a first embodiment will be described. FIG. 1 illustrates a circuit diagram of the power amplifier circuit 10. The power amplifier circuit 10 includes transistors 101, 111, 112, and 113, a resistance element 121, a capacitor 131, matching circuits 141 and 151, and an inductor 161.

The transistor 101 includes a plurality of unit transistors (fingers) connected in parallel to each other so as to function as a single transistor. In the following description, the base, emitter, and collector of the transistor 101 mean the base, emitter, and collector of each unit transistor, respectively. The transistor 101 is, for example, a transistor such as a heterojunction bipolar transistor (HBT).

The transistor 101 (first transistor) is disposed in a disposition area A1 on a semiconductor substrate (not illustrated). The transistor 101 has a base connected to the capacitor 131 and the resistance element 121, a collector connected to the matching circuit 151, and an emitter connected to ground. The collector of the transistor 101 is supplied with a power supply voltage Vcc1 through the inductor 161.

The transistor 101 amplifies a signal RFin inputted from an input terminal 171. The transistor 101 amplifies the signal RFin inputted to the base thereof on the basis of a bias current Ib outputted from the transistor 111 (second transistor), which will be described below. The signal RFin amplified by the transistor 101 is outputted as a signal RFout through the matching circuit 151. The signal RFin has a frequency of about several GHz.

The transistor 111 has a base connected to a current source 181, a collector connected to a power supply, and an emitter connected to the resistance element 121. The collector of the transistor 111 is supplied with a power supply voltage Vcc0. The current source 181 represents a control current Ic supplied from a control circuit. The transistor 111 is switched between an ON-state and an OFF-state by a current I1 supplied to the base thereof on the basis of the control current Ic. In an ON-state, the transistor 111 outputs the bias current Ib.

The transistor 112 (third transistor) is a diode-connected transistor and has a collector connected to an emitter of the transistor 113 and an emitter connected to ground. The collector of the transistor 112 is supplied with a current I2. The transistor 112 outputs a current I3 from the emitter on the basis of the current I2. The transistor 112 is disposed in a disposition area A2 on the semiconductor substrate.

The transistor 113 is a diode-connected transistor and has a collector connected to the current source 181 and the base of the transistor 111 and an emitter connected to the collector of the transistor 112. The transistor 113 outputs the current I2 to the collector of the transistor 112 on the basis of a current I4 flowing through the collector on the basis of the control current Ic.

The transistors 111, 112, and 113 constitute a bias circuit.

The matching circuit 141 has one end connected to the input terminal 171 and the other end connected to the capacitor 131. The matching circuit 141 achieves impedance matching between the input terminal 171 and the capacitor 131.

The matching circuit 151 has one end connected to the collector of the transistor 101 and the other end connected to an output terminal 191. The matching circuit 151 achieves impedance matching between the collector of the transistor 101 and the output terminal 191.

Figure 2:
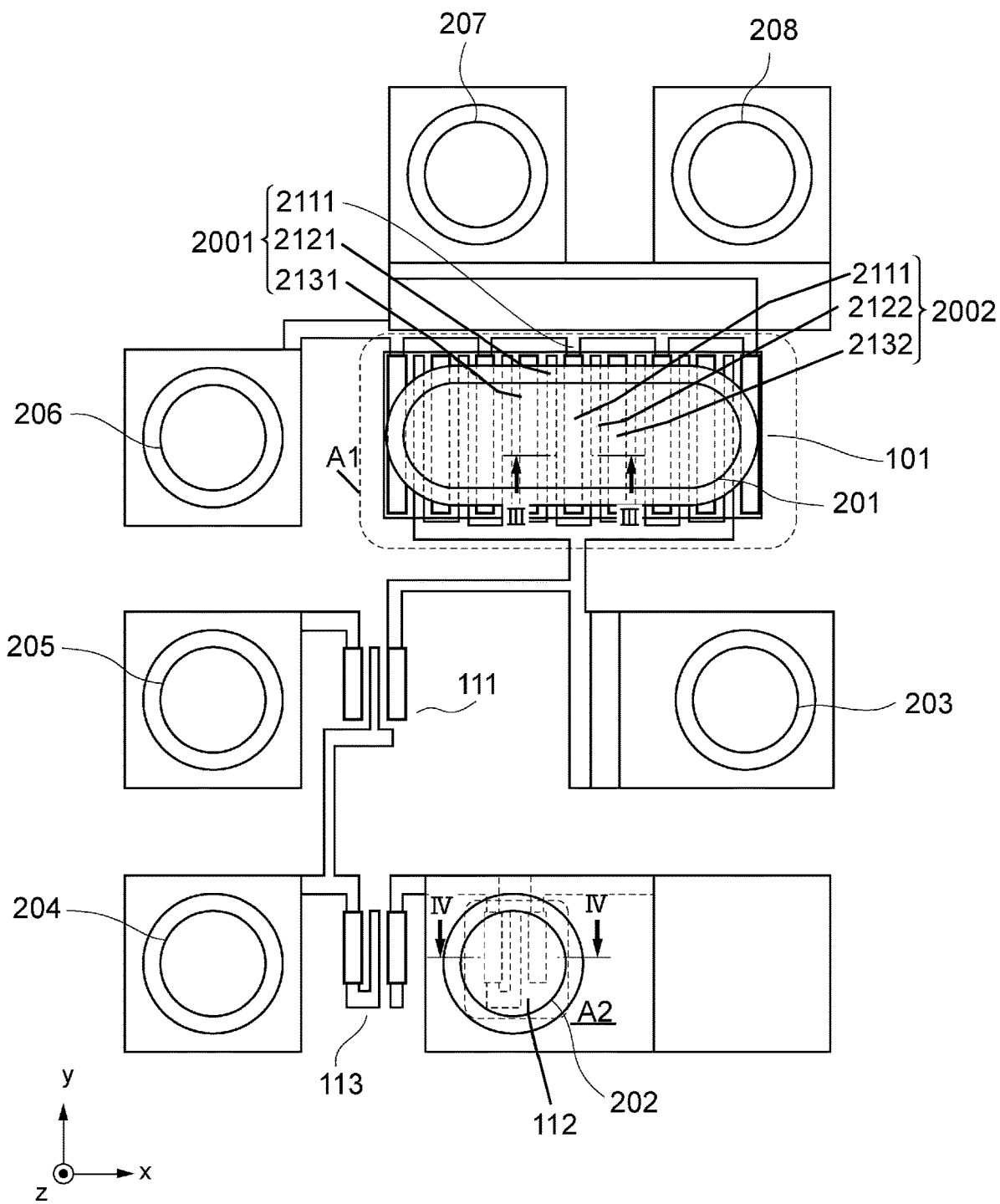
FIG. 2 is a layout diagram of the power amplifier circuit according to the first embodiment.

The layout of the power amplifier circuit 10 according to the first embodiment in plan view of the semiconductor substrate will be described with reference to FIG. 2.

The transistor 101 is disposed in the disposition area A1. The transistor 101 includes a plurality of unit transistors including unit transistors 2001 and 2002. The unit transistor 2001 has a collector 2111, a base 2121, and an emitter 2131. The unit transistor 2002 has the collector 2111, a base 2122, and an emitter 2132. The unit transistors 2001 and 2002 share the collector 2111.

The signal RFin is supplied to the base of the transistor 101 through a bump 203. The power supply voltage Vcc1 is supplied to the collector of the transistor 101 through a bump 206. The signal amplified by the transistor 101 is outputted to the outside through a bump 207 and a bump 208.

A bump 201 is disposed above the transistor 101, that is, in a z-axis positive direction with respect to the transistor 101. The bump 201 is disposed so as to overlap the disposition area A1. Specifically, the bump 201 covers the emitters of the plurality of unit transistors constituting the transistor 101. The transistor 101 is electrically connected to a module substrate (not illustrated) via the bump 201.

The transistor 112 is disposed in the disposition area A2. A bump 202 is disposed above the transistor 112, that is, in the z-axis positive direction with respect to the transistor 112. The bump 202 is disposed so as to overlap the disposition area A2.

The transistor 112 is connected to the emitter of the transistor 113. The transistor 113 is connected to a bump 204. The control current Ic is inputted from the bump 204.

The transistor 113 is connected to the transistor 111. The power supply voltage Vcc0 is supplied to the transistor 111 through a bump 205.

The cross-sectional structure of the transistor 101 will be described with reference to FIG. 3. Here, the unit transistors 2001 and 2002 included in the transistor 101 will be described. The unit transistors 2001 and 2002 are disposed on a semiconductor substrate 301. A detailed structure will be described about the unit transistor 2002. A sub-collector layer 302 is disposed on the semiconductor substrate 301. The semiconductor substrate 301 is made of, for example, semi-insulating GaAs. The sub-collector layer 302 is made of, for example, high-concentration n-type GaAs. The sub-collector layer 302 has a thickness of about 0.5 μm, for example.

A collector layer 303 is disposed on the sub-collector layer 302. The collector layer 303 is made of, for example, n-type GaAs. The collector layer 303 has a thickness of about 1 μm, for example. A base layer 304 is disposed on the collector layer 303. The base layer 304 is made of, for example, p-type GaAs. The base layer 304 has a thickness of about 100 nm, for example.

An emitter layer 305 is disposed on the base layer 304. The emitter layer 305 includes an intrinsic emitter layer 305A and an emitter mesa layer 305B. The intrinsic emitter layer 305A is disposed on the base layer 304. The emitter mesa layer 305B is disposed on the intrinsic emitter layer 305A. The intrinsic emitter layer 305A is made of, for example, n-type InGaP. The intrinsic emitter layer 305A has a thickness of about 30 nm or more and about 40 nm or less, for example. The emitter mesa layer 305B is made of, for example, high-concentration n-type GaAs and high-concentration n-type InGaP. In the emitter mesa layer 305B, for example, a high-concentration n-type InGaP layer having a thickness of about 100 nm is disposed on a high-concentration n-type GaAs layer having a thickness of about 100 nm.

A ledge layer 306 is disposed on an upper surface of the base layer 304, in an area in which the emitter layer 305 is not disposed. The ledge layer 306 is deposited together with the intrinsic emitter layer 305A and has the same composition as that of the intrinsic emitter layer 305A. Because the emitter mesa layer 305B is not disposed on the ledge layer 306, the ledge layer 306 is depleted and thus does not function as an emitter of the transistor. Thus, the intrinsic emitter layer 305A and the emitter mesa layer 305B are referred to as the emitter layer 305, and the ledge layer 306 is distinguished from the emitter layer 305.

The collector layer 303, the base layer 304, and the emitter layer 305 constitute the unit transistor 2002. The same applies to the unit transistor 2001.

A base electrode 331 is disposed on the base layer 304. The base electrode 331 is in ohmic contact with the base layer 304 through a cavity disposed in the ledge layer 306. The base electrode 331 is disposed between portions of the emitter layer 305 in each of the unit transistors 2001 and 2002.

A collector electrode 332 is disposed on the sub-collector layer 302. The collector electrode 332 is in ohmic contact with the sub-collector layer 302. The collector electrode 332 is disposed between the unit transistor 2001 and the unit transistor 2002 in an x-axis direction. The collector electrode 332 is connected to the collector layer 303 via the sub-collector layer 302. The collector electrode 332 is shared between the unit transistor 2001 and the unit transistor 2002.

An emitter electrode 333 is disposed on the emitter layer 305. The emitter electrode 333 is in ohmic contact with the emitter layer 305.

The base electrode 331 is formed by stacking, for example, a Ti film, a Pt film, and a Au film in order on the base layer 304. The collector electrode 332 is formed by stacking, for example, a AuGe film, a Ni film, and a Au film in order on the sub-collector layer 302. The emitter electrode 333 is formed of, for example, a Ti film having a thickness of about 50 nm.

Figure 3:
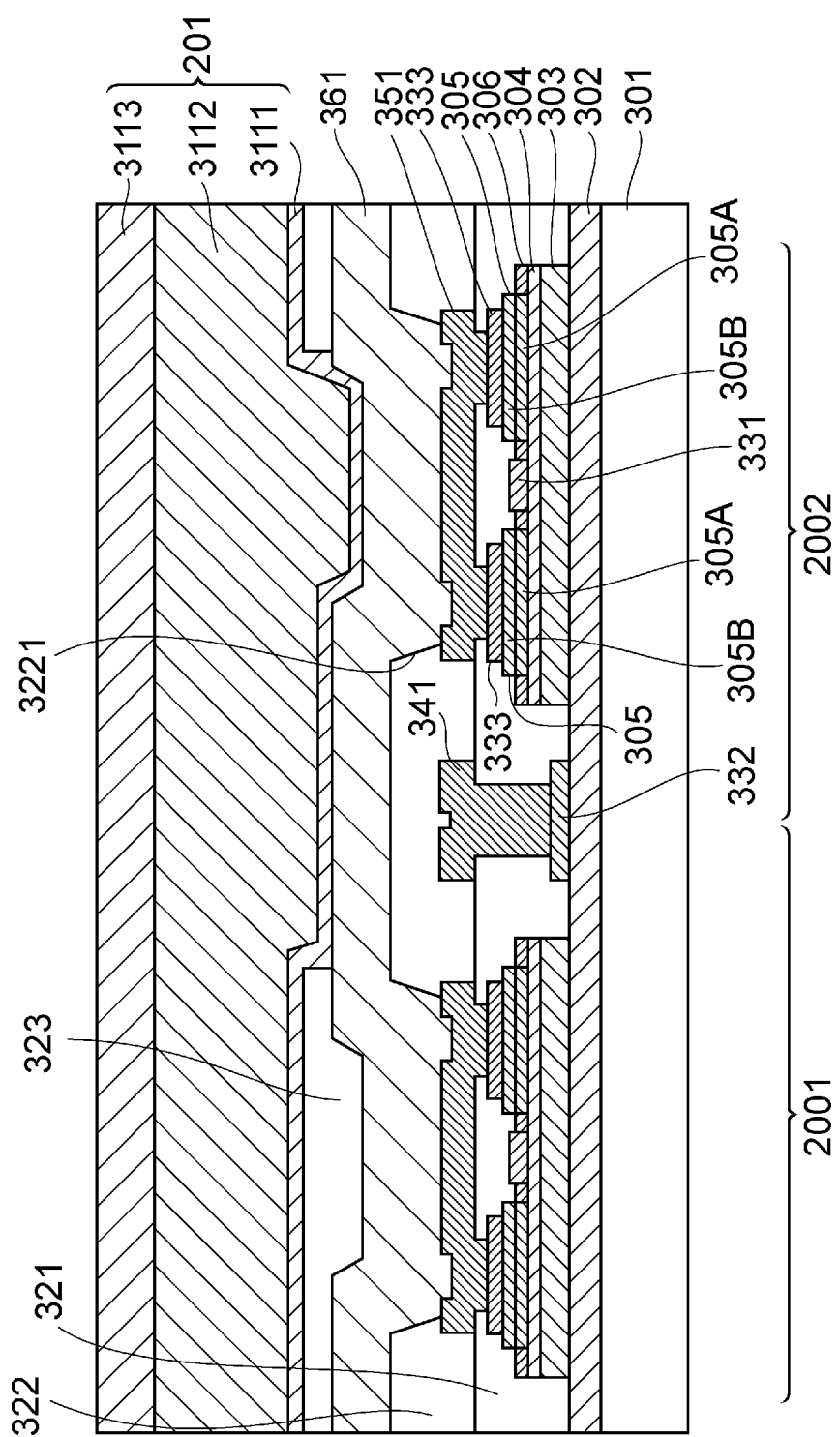
FIG. 3 is a cross-sectional view taken along line III-III in FIG. 2.

In an area of the sub-collector layer 302 not seen in FIG. 3, an isolation area for isolating elements is disposed. The isolation area is formed by insulating a part of the sub-collector layer 302 by using, for example, an ion implantation technique.

A first insulating film 321 is disposed so as to cover the unit transistors 2001 and 2002. The first insulating film 321 has a multilayer structure formed of, for example, a SiN layer and a resin layer. Alternatively, the first insulating film 321 may be formed of only a SiN layer.

A first-layer collector wiring line 341 is disposed on the first insulating film 321. The first-layer collector wiring line 341 is disposed through the first insulating film 321 and connected to the collector electrode 332.

A first-layer emitter wiring line 351 is disposed on the first insulating film 321. The first-layer emitter wiring line 351 is disposed in each of the unit transistors 2001 and 2002. The first-layer emitter wiring line 351 connects the emitter electrodes 333 of each unit transistor. The first-layer collector wiring line 341 and the first-layer emitter wiring line 351 each have a multilayer structure formed of, for example, a Ti film having a thickness of about 10 nm or more and about 50 nm or less, and an Au film having a thickness of about 1 μm or more and about 2 μm or less.

A second insulating film 322 is disposed on the first insulating film 321 so as to cover the first-layer collector wiring line 341 and the first-layer emitter wiring line 351. The second insulating film 322 has a multilayer structure formed of, for example, a SiN layer and a resin layer. Alternatively, the second insulating film 322 may be formed of only a SiN layer.

An emitter wiring line 361 is disposed on the second insulating film 322. The emitter wiring line 361 is connected to the first-layer emitter wiring line 351 through a cavity 3221 disposed in the second insulating film 322. The first-layer emitter wiring lines 351 of the unit transistors 2001 and 2002 arranged in the x-axis direction are connected to each other via the emitter wiring line 361. The emitter wiring line 361 has a multilayer structure formed of, for example, a Ti film having a thickness of about 10 nm or more and about 50 nm or less, and a Au film having a thickness of about 2 μm or more and about 4 μm or less.

A third insulating film 323 is disposed on the emitter wiring line 361 so as to cover the emitter wiring line 361. The third insulating film 323 has a multilayer structure formed of, for example, a SiN layer and a resin layer. Alternatively, the third insulating film 323 may be formed of only a SiN layer. The third insulating film 323 functions as a protective film that protects the unit transistors 2001 and 2002.

The bump 201 is disposed on the third insulating film 323. The bump 201 is connected to the emitter wiring line 361 through a cavity of the third insulating film 323. The bump 201 has a multilayer structure in which an under bump metal layer 3111, a metal post 3112, and a solder layer 3113 are stacked in this order.

The under bump metal layer 3111 is formed of, for example, a Ti film having a thickness of about 50 nm or more and about 100 nm or less. The under bump metal layer 3111 has a function of increasing adhesion of the bump 201 to the third insulating film 323.

The metal post 3112 is formed of, for example, a Cu film having a thickness of about 30 μm or more and about 50 μm or less. The solder layer 3113 is formed of, for example, a film made of Sn or a SnAg alloy and having a thickness of about 10 μm or more and about 30 μm or less.

Alternatively, a barrier metal layer made of Ni or the like and preventing mutual diffusion may be disposed between the metal post 3112 and the solder layer 3113.

Figure 4:
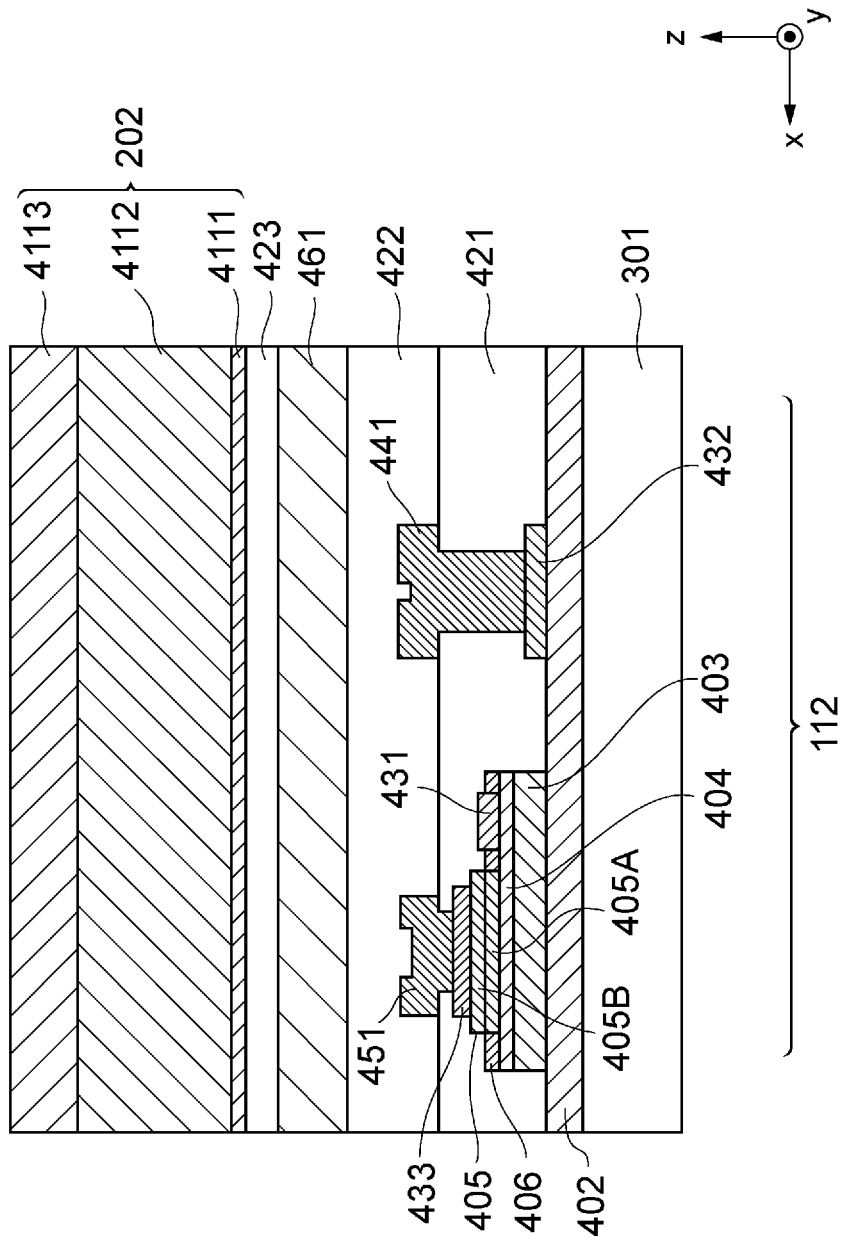
FIG. 4 is a cross-sectional view taken along line IV-IV in FIG. 2.

The cross-sectional structure of the transistor 112 will be described with reference to FIG. 4. A sub-collector layer 402 is disposed on the semiconductor substrate 301. A collector layer 403 is disposed on the sub-collector layer 402. A base layer 404 is disposed on the collector layer 403. An emitter layer 405 and a ledge layer 406 are disposed on the base layer 404. The emitter layer 405 includes an intrinsic emitter layer 405A and an emitter mesa layer 405B. The relationship among the intrinsic emitter layer 405A, the emitter mesa layer 405B, and the ledge layer 406 is similar to the relationship among the intrinsic emitter layer 305A, the emitter mesa layer 305B, and the ledge layer 306.

The collector layer 403, the base layer 404, and the emitter layer 405 constitute the transistor 112.

The transistor 112 is formed by the same process as the process of forming the unit transistors 2001 and 2002. Thus, the characteristics of the transistor 112 are changed by a stress as with the unit transistors 2001 and 2002.

A base electrode 431 is disposed on the base layer 404. The base electrode 431 is in ohmic contact with the base layer 404 through a cavity disposed in the ledge layer 406. A collector electrode 432 is disposed on the sub-collector layer 402. The collector electrode 432 is in ohmic contact with the sub-collector layer 402. The collector electrode 432 is connected to the collector layer 403 via the sub-collector layer 402. An emitter electrode 433 is disposed on the emitter layer 405. The emitter electrode 433 is in ohmic contact with the emitter layer 405.

The base electrode 431, the collector electrode 432, and the emitter electrode 433 are formed by the same processes as the processes of forming the base electrode 331, the collector electrode 332, and the emitter electrode 333, respectively.

In the transistor 112, the base electrode 431 and the collector electrode 432 are short-circuited by a wiring line disposed outside the area illustrated in this cross section, and the base layer 404 and the emitter layer 405 constitute a PN diode.

A first insulating film 421 is disposed so as to cover the transistor 112. The first insulating film 421 has a multilayer structure formed of, for example, a SiN layer and a resin layer. Alternatively, the first insulating film 421 may be formed of only a SiN layer.

A first-layer collector wiring line 441 is disposed on the first insulating film 421. The first-layer collector wiring line 441 is disposed through the first insulating film 421 and is connected to the collector electrode 432.

A first-layer emitter wiring line 451 is disposed on the first insulating film 421.

A second insulating film 422 is disposed on the first insulating film 421 so as to cover the first-layer collector wiring line 441 and the first-layer emitter wiring line 451. The second insulating film 422 has a multilayer structure formed of, for example, a SiN layer and a resin layer. Alternatively, the second insulating film 422 may be formed of only a SiN layer.

The materials and structures of the collector wiring line 441, the first-layer emitter wiring line 451, and the metal layer 461 are similar to those of the collector wiring line 341, the first-layer emitter wiring line 351, and the emitter wiring line 361, respectively.

A third insulating film 423 is disposed on the metal layer 461 so as to cover the metal layer 461. The third insulating film 423 has a multilayer structure formed of, for example, a SiN layer and a resin layer. Alternatively, the third insulating film 423 may be formed of only a SiN layer. The third insulating film 423 functions as a protective film that protects the transistor 112.

The bump 202 is disposed on the third insulating film 423. The bump 202 has a multilayer structure in which an under bump metal layer 4111, a metal post 4112, and a solder layer 4113 are stacked in this order.

The materials and dimensions of the under bump metal layer 4111, the metal post 4112, and the solder layer 4113 are similar to those of the under bump metal layer 3111, the metal post 3112, and the solder layer 3113. Thus, the bump 201 and the bump 202 have a substantially identical thickness in a z-axis direction.

Alternatively, a barrier metal layer made of Ni or the like and preventing mutual diffusion may be disposed between the metal post 4112 and the solder layer 4113.

In the power amplifier circuit 10, the first insulating film 321 and the first insulating film 421, the second insulating film 322 and the second insulating film 422, and the third insulating film 323 and the third insulating film 423 are formed by the same processes, respectively, but are isolated from each other. Alternatively, the first insulating film 321 and the first insulating film 421, the second insulating film 322 and the second insulating film 422, and the third insulating film 323 and the third insulating film 423 may be respectively integrated together instead of being isolated from each other.

In the power amplifier circuit 10, the emitter wiring line 361 and the metal layer 461 are formed by the same process but are isolated from each other. Alternatively, the emitter wiring line 361 and the metal layer 461 may be integrated together instead of being isolated from each other. Specifically, the metal layer 461 may be formed as a part of the emitter wiring line 361 by extending the emitter wiring line 361 to a region above the transistor 112.

Figure 5:
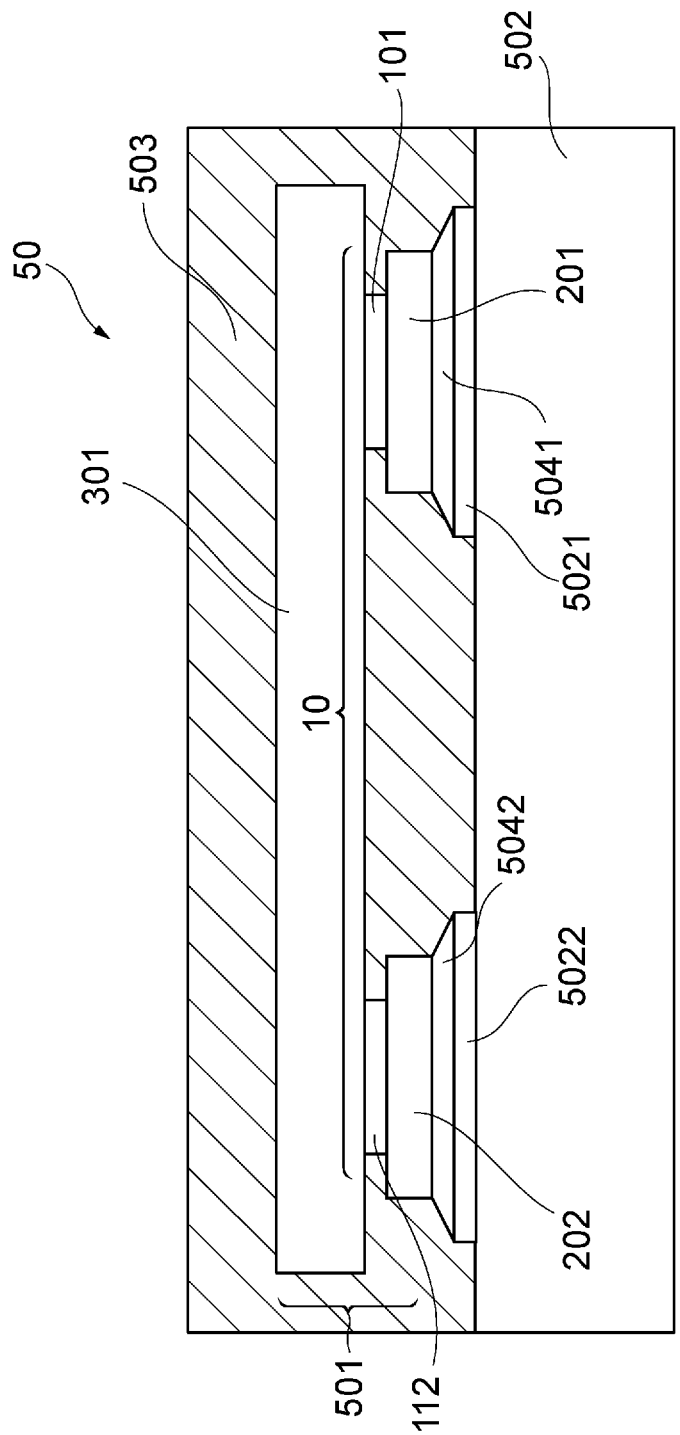
FIG. 5 is a cross-sectional view of a semiconductor device including a semiconductor chip mounted therein.

FIG. 5 illustrates a cross-sectional view of a semiconductor device 50. The cross-sectional view in FIG. 5 is a cross-sectional view taken along a y-z plane in FIG. 2. The semiconductor device 50 includes a semiconductor chip 501, a module substrate 502, and a resin mold 503.

The semiconductor chip 501 includes the power amplifier circuit 10. The transistor 101 and the transistor 112 are connected to the module substrate 502 via the bump 201 and the bump 202, respectively. The bump 201 and the bump 202 are connected to a solder 5041 and a solder 5042, respectively.

The module substrate 502 has a substrate electrode 5021 and a substrate electrode 5022. The substrate electrode 5021 and the substrate electrode 5022 are connected to the solder 5041 and the solder 5042, respectively.

The resin mold 503 is disposed on the module substrate 502 so as to cover the semiconductor chip 501, the solders 5041 and 5042, and the substrate electrodes 5021 and 5022.

A thermal stress in the semiconductor device 50 will be described. In the semiconductor device 50, the bumps 201 and 202 have a thermal expansion coefficient different from that of the resin mold 503. The thermal expansion coefficient of the bumps 201 and 202 is higher than the thermal expansion coefficient of the resin mold 503.

When the external temperature of the semiconductor device 50 increases, the bumps 201 and 202 and the resin mold 503 thermally expand. Because the bump 201 has a higher thermal expansion coefficient, a change in dimension caused by a change in temperature is greater in the bump 201 than in the resin mold 503. Because the bump 201 is surrounded by the resin mold 503, the thermal expansion of the bump 201 is restrained by the resin mold 503. The bump 201, the deformation thereof being restrained, applies a stress not only to the resin mold 503 but also to the transistor 101 and the solder 5041 that are in contact with the bump 201.

As a result, for example, in each unit transistor of the transistor 101, such as the unit transistor 2001, the base-emitter voltage of each unit transistor is shifted by a thermal stress. The shift of the base-emitter voltage of each unit transistor causes a variation in the operation point of each unit transistor.

The semiconductor device 50 includes the bump 202. When the bump 202 thermally expands, the bump 202 applies a thermal stress to the transistor 112, as with the bump 201. Accordingly, in the transistor 112, the thermal stress causes the base-emitter voltage of the transistor 112 to be shifted. The shift of the base-emitter voltage of the transistor 112 causes a variation in the operation point of the transistor 112.

The characteristics of each unit transistor of the transistor 101 vary due to a thermal stress such that the threshold voltage of each unit transistor increases. The increase in the threshold voltage causes a decrease in the collector current of each unit transistor of the transistor 101. The decrease in the collector current of each unit transistor of the transistor 101 causes deviation from a desired amplification characteristic, that is, degradation of the performance of the power amplifier circuit 10.

The characteristics of the transistor 112 vary due to a thermal stress such that the threshold voltage of the transistor 112 increases. The increase in the threshold voltage causes a decrease in the current I2 flowing through the collector of the transistor 112. The decrease in the current I2 causes an increase in the current I1 because the current I2 in the control current Ic decreases. The increase in the current I1 causes an increase in the bias current Ib from the transistor 111.

The increase in the bias current Ib supplied to each unit transistor of the transistor 101 causes an increase in the corrector current of each unit transistor. Thus, the decrease in the collector current of each unit transistor of the transistor 101 resulting from the thermal stress is compensated for by the increase in the bias current Ib.

In the power amplifier circuit 10, a decrease in the collector current is compensated for by an increase in the bias current Ib, and thereby an influence of a thermal stress on the power amplifier circuit 10 can be reduced.

In the power amplifier circuit 10, the member that applies a stress to each unit transistor of the transistor 101 or the transistor 112 is not limited to the bump 201 or 202, and may be any metal member that is disposed so as to apply a stress to each unit transistor of the transistor 101 or the transistor 112 by using a difference in thermal expansion coefficient from the resin mold 503 when the power amplifier circuit 10 is mounted.

As a modification example of the first embodiment, the following configuration may be adopted. In FIG. 2, the bump 202 is disposed above the transistor 112. In contrast to this, the bump 202 may be disposed above the transistor 113, not above the transistor 112. A mechanism of changing the bias current Ib of the transistor 113 in accordance with the stress of the bump 202 is the same as the mechanism in the configuration according to the first embodiment.

A second embodiment will be described. In the second embodiment and the following embodiment, a description of the same points as those of the first embodiment will be omitted, and only different points will be described. In particular, similar functions and effects obtained by similar configurations will not be described in each embodiment.

Figure 6:
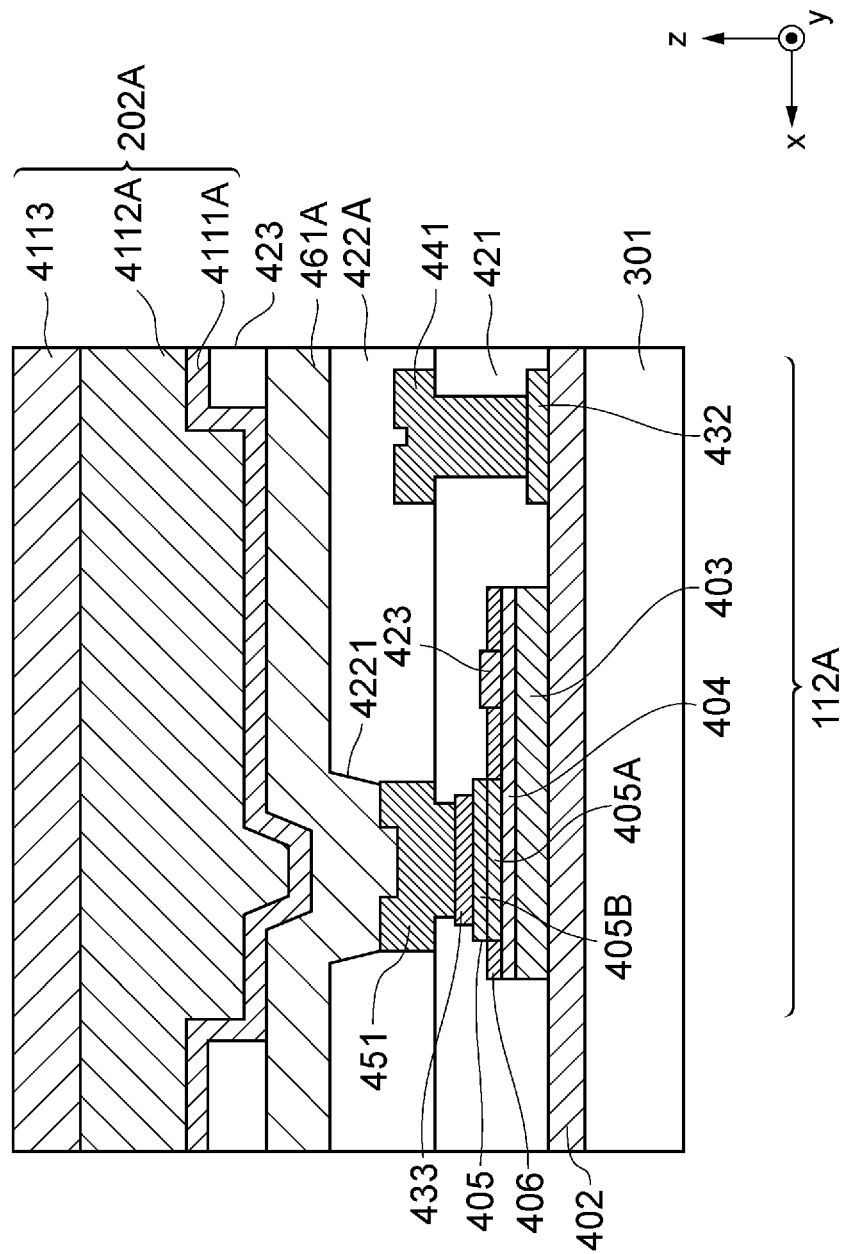
FIG. 6 is a cross-sectional view of a power amplifier circuit according to a second embodiment.

A power amplifier circuit according to the second embodiment includes a transistor column and transistors similar to those according to the first embodiment. FIG. 6 is a cross-sectional view along a plane including a transistor 112A in the power amplifier circuit according to the second embodiment. FIG. 6 is a cross-sectional view viewed from the same direction as in FIG. 4.

In the power amplifier circuit according to the second embodiment, a second insulating film 422A has a cavity 4221. A metal layer 461A extends toward the first-layer emitter wiring line 451 through the cavity 4221. The metal layer 461A is in ohmic contact with the first-layer emitter wiring line 451. The metal layer 461A is electrically connected to the emitter electrode 433 via the first-layer emitter wiring line 451. The shapes of an under bump metal layer 4111A and a metal post 4112A of a bump 202A are changed in accordance with the shape of the metal layer 461A. The bump 202A is electrically connected to the emitter electrode 433.

In the power amplifier circuit according to the second embodiment, when a stress resulting from a thermal stress is applied from the outside, the second insulating film 422A is elastically deformed to absorb a small amount of stress. Accordingly, more stress can be applied to the transistor 112A. Thus, the sensitivity to variation of the transistor 112A is increased with respect to a characteristic variation of each unit transistor of the transistor 101 caused by a stress resulting from a thermal stress. Accordingly, the characteristic variation of each unit transistor of the transistor 101 can be compensated for more appropriately.

In addition, in the power amplifier circuit according to the second embodiment, the metal layer 461A can be used as a wiring line and thus a routing area of wiring lines decreases. The decrease in the routing area of wiring lines makes it possible to reduce the size of a semiconductor chip including the power amplifier circuit.

Figure 7:
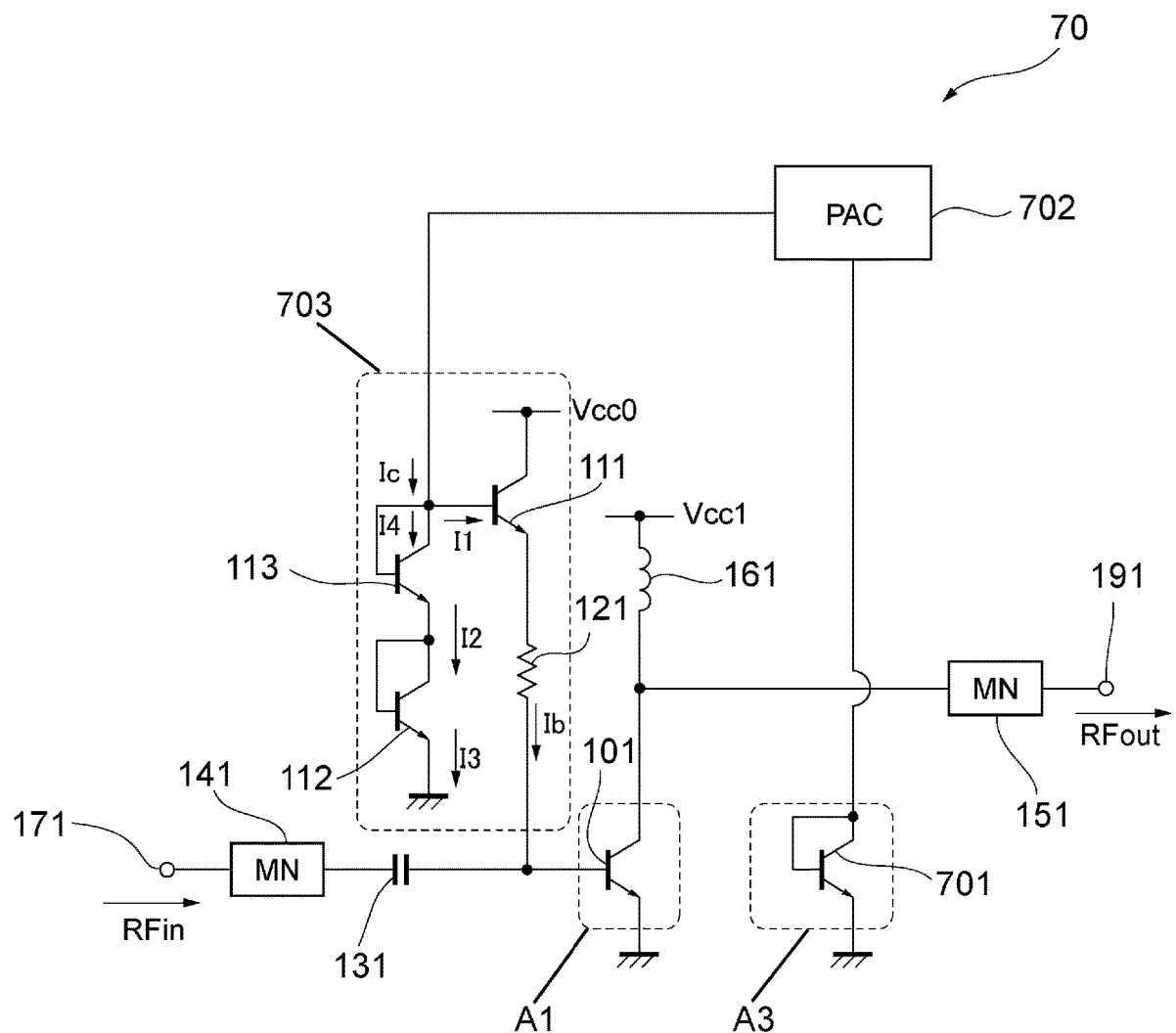
FIG. 7 is a circuit diagram of a power amplifier circuit according to a third embodiment.

A third embodiment will be described. FIG. 7 illustrates a circuit diagram of a power amplifier circuit 70 according to the third embodiment. The power amplifier circuit 70 includes a transistor 701 and a control circuit 702 in addition to the elements of the power amplifier circuit 10. Note that the power amplifier circuit 70 is different from the power amplifier circuit 10 in not including the current source 181.

Here, a bias circuit including the transistors 111, 112, and 113 and the resistance element 121 is referred to as a bias circuit 703. The circuit configuration inside the bias circuit 703 is not limited to the one illustrated in FIG. 7. The bias circuit 703 may have another circuit configuration as long as being configured to supply the bias current Ib to the transistor 101 on the basis of the control current Ic.

In this embodiment, the transistor 701 that is diode-connected is used as a diode. The transistor 701 is disposed in a disposition area A3 on a semiconductor substrate (not illustrated). The transistor 701 has a collector connected to the control circuit 702, a base connected to the collector, and an emitter connected to ground. The transistor 701, the base thereof being diode-connected to the collector, can be regarded as an element having two terminals.

The transistor 701 has the base and collector that serve as an anode connected to the control circuit 702, and the emitter that serves as a cathode connected to ground. The transistor 701 operates as a diode having a rectification function of allowing a current to flow from the control circuit 702 side to the ground side. The transistor 701 may be replaced with a diode. In a case where the transistor 701 is replaced with a diode, the anode thereof is connected to the control circuit 702 and the cathode thereof is connected to ground.

The control circuit 702 is connected to the transistor 701 and the bias circuit 703. Specifically, the control circuit 702 has one terminal connected to the collector of the transistor 701 and the other terminal connected to the base of the transistor 111 and the collector of the transistor 113. The control circuit 702 is a circuit that controls power amplification of the power amplifier circuit 70 (power amplifier controller (PAC)). In one embodiment of the present disclosure, the control circuit 702 and the power amplifier circuit 70 may be formed on one semiconductor chip or a plurality of semiconductor chips.

The control circuit 702 supplies the control current Ic to the bias circuit 703 of the power amplifier circuit 70. The control circuit 702 applies a voltage to the transistor 701 and monitors the base-emitter voltage of the transistor 701, that is, the forward voltage of the transistor 701. The control circuit 702 detects, for example, a variation in the forward voltage of the transistor 701 relative to a certain reference voltage, thereby detecting a characteristic variation of the transistor 701. On the basis of the characteristic variation, the control circuit 702 increases or decreases the amount of the control current Ic. The control circuit 702 performs current control in this embodiment. Alternatively, the control circuit 702 may perform voltage control as well as current control.

Figure 8:
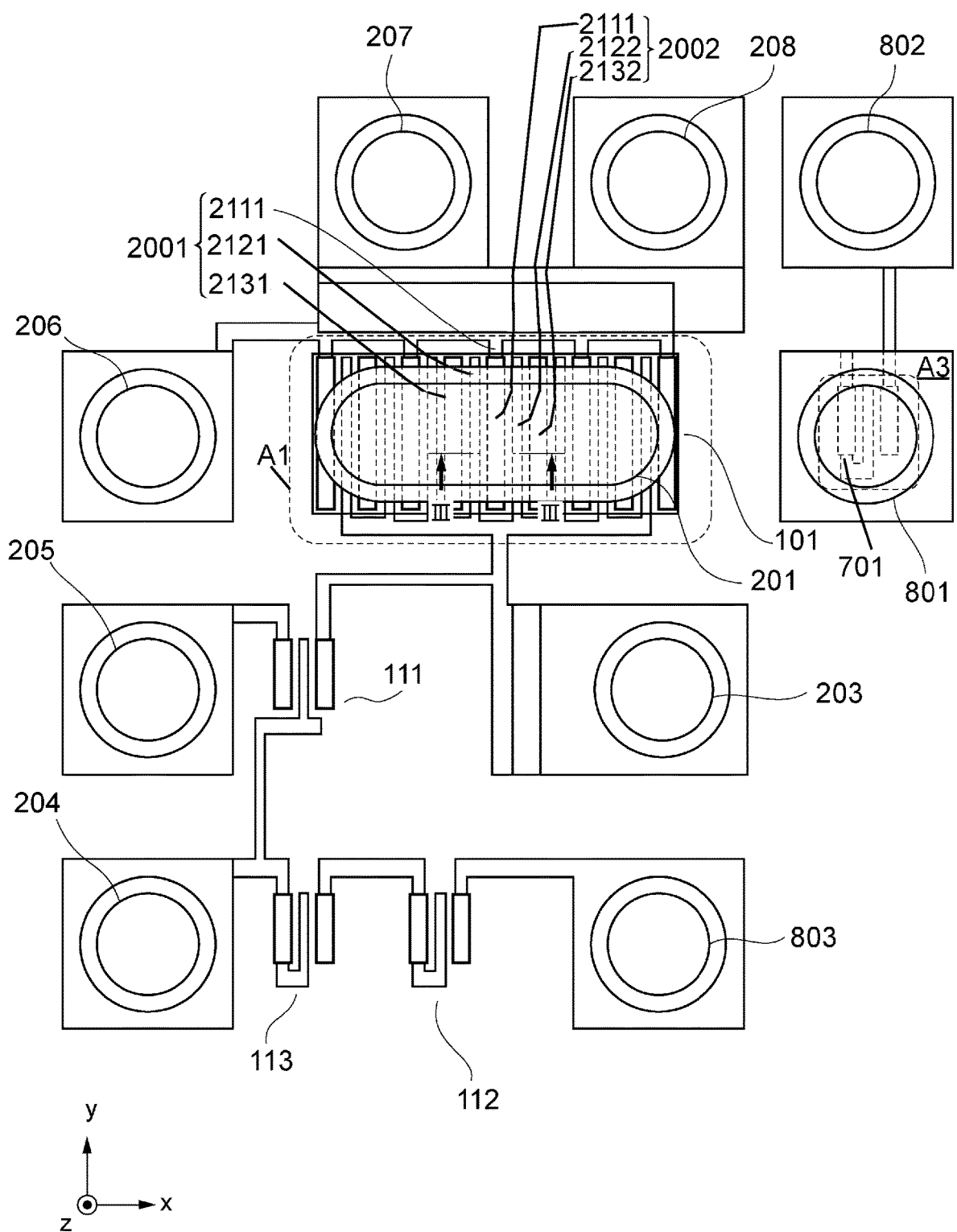
FIG. 8 is a layout diagram of the power amplifier circuit according to the third embodiment.

The layout of the power amplifier circuit 70 according to the third embodiment in plan view of the semiconductor substrate will be described with reference to FIG. 8.

The power amplifier circuit 70 is similar to the power amplifier circuit 10 in that the transistor 101 is disposed in the disposition area A1 and that the bump 201 is disposed above the transistor 101. Also, the cross-sectional structure of the transistor 101 is similar to that in the power amplifier circuit 10. In the power amplifier circuit 70, unlike in the power amplifier circuit 10, no bump is disposed above the transistor 112. The emitter of the transistor 112 is connected to a bump 803.

The transistor 701 is disposed in the disposition area A3. A bump 801 is disposed above the transistor 701, that is, in the z-axis positive direction with respect to the transistor 701. The bump 801 is disposed so as to overlap the disposition area A3.

The transistor 701 is connected to a bump 802. The bump 802 is connected to the control circuit 702 (not illustrated). The transistor 701 is connected to ground via a bump that is not illustrated. The cross-sectional structure of the transistor 701 is similar to the cross-sectional structure of the transistor 112A illustrated in FIG. 6. Alternatively, the cross-sectional structure of the transistor 701 may be similar to the cross-sectional structure of the transistor 112 illustrated in FIG. 4, and may be grounded via the bump 801.

The bump 204 connected to the transistor 113 is connected to the control circuit 702. The control current Ic from the control circuit 702 is inputted from the bump 204.

In a case where the power amplifier circuit 70 is included in a modularized semiconductor device as in FIG. 5 of the first embodiment, the characteristics of each unit transistor of the transistor 101 vary due to a thermal stress such that the threshold voltage of each unit transistor increases, as in the first embodiment. The increase in the threshold voltage causes a decrease in the collector current of each unit transistor of the transistor 101. The decrease in the collector current of each unit transistor of the transistor 101 causes deviation from a desired amplification characteristic, that is, degradation of the performance of the power amplifier circuit 70.

In the power amplifier circuit 70, a thermal stress is applied also to the transistor 701 disposed near the transistor 101 via the bump 801. The application of the thermal stress to the transistor 701 causes the characteristics of the transistor 701 to vary such that the threshold voltage of the transistor 701 increases. Because the transistor 701 is disposed near the transistor 101, the threshold voltage of the transistor 701 varies in conjunction with a characteristic variation caused by the thermal stress applied to the transistor 101.

The increase in the threshold voltage of the transistor 701 causes an increase in the forward voltage of the transistor 701, and also causes a decrease in the collector current of the transistor 701, that is, the forward current of the transistor 701.

The control circuit 702 monitors the forward voltage of the transistor 701 and is thus capable of detecting a characteristic variation of the transistor 701 as an increase in the forward voltage resulting from a thermal stress. As a result of detecting the characteristic variation of the transistor 701, the control circuit 702 is capable of detecting that the collector current of each unit transistor of the transistor 101 is decreasing.

The control circuit 702 increases the control current Ic to be supplied to the bias circuit 703 to compensate for the decrease in the collector current of each unit transistor of the transistor 101. The increase in the control current Ic causes an increase in the current I1. The increase in the current I1 causes an increase in the bias current Ib from the transistor 111. The increase in the bias current Ib compensates for the decrease in the collector current in each unit transistor of the transistor 101 resulting from the thermal stress. Accordingly, an influence of the thermal stress on the power amplifier circuit 70 can be reduced.

The control circuit 702 may monitor the forward current of the transistor 701 and may detect a characteristic variation of the transistor 701 as a decrease in the forward current resulting from a thermal stress. For example, the control circuit 702 detects a variation in the forward current of the transistor 701 relative to a certain reference current, thereby detecting a characteristic variation of the transistor 701. Also, in this case, as a result of detecting the characteristic variation of the transistor 701, the control circuit 702 is capable of detecting that the collector current of each unit transistor of the transistor 101 is decreasing.

In the power amplifier circuit 70, the member that applies a stress to each unit transistor of the transistor 101 or the transistor 701 is not limited to the bump 201 or 801, and may be any metal member that is disposed so as to apply a stress to each unit transistor of the transistor 101 or the transistor 701 by using a difference in thermal expansion coefficient from the resin mold 503 when the power amplifier circuit 70 is mounted in a manner similar to that in FIG. 5.

Figure 9:
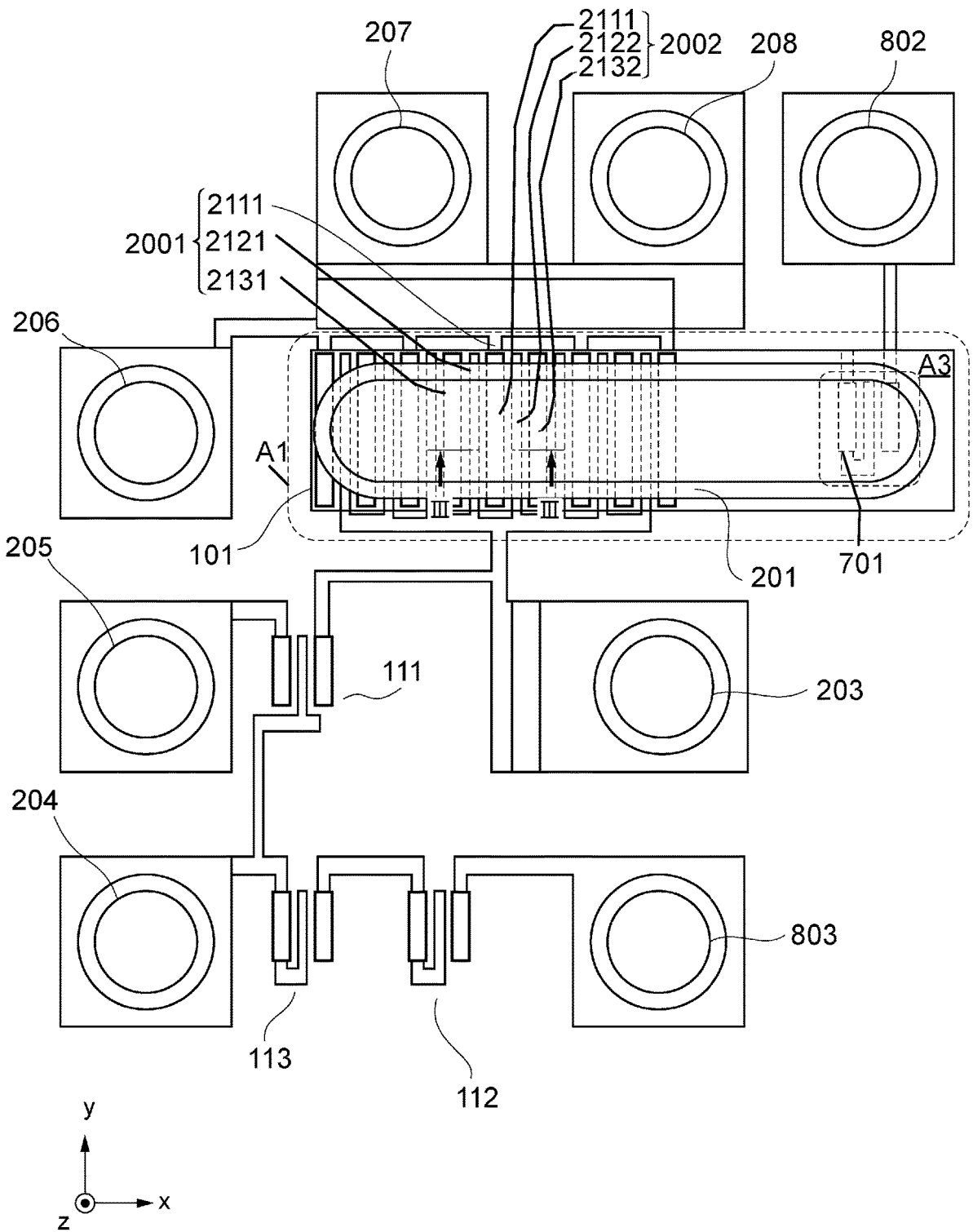
FIG. 9 is a layout diagram of a power amplifier circuit according to a modification example of the third embodiment.

As a modification example of the third embodiment, the following configuration may be adopted. In FIG. 8, the bump 201 and the bump 801 are isolated from each other. In contrast to this, as illustrated in FIG. 9, the bump 801 may be integrated with the bump 201, and the bump 201 may be disposed so as to overlap the disposition area A1 and the disposition area A3. The stress from the bump 201 is applied to the transistor 101 and the transistor 701. A decrease in the collector current of the transistor 101 resulting from the stress from the bump 201 is detected by the control circuit 702, as an increase in the forward voltage of the transistor 701 resulting from the stress from the bump 201. As in the configuration according to the third embodiment, the decrease in the collector current of the transistor 101 is compensated for by using the control circuit 702.

Exemplary embodiments of the present disclosure have been described above. The power amplifier circuit 10 according to the first embodiment includes the transistor 101 disposed on the semiconductor substrate 301; the transistor 111 disposed on the semiconductor substrate 301 and having the base configured to be supplied with the current I1 which is a part of the control current Ic, the transistor 111 being configured to supply the bias current Ib based on the current I1 to the transistor 101; the transistor 112 disposed on the semiconductor substrate 301 and having the collector configured to be supplied with the current I2 which is a part of the control current Ic and the emitter configured to output the current I3 based on the current I2; the bump 201 electrically connected to the emitter of the transistor 101 and disposed so as to overlap the disposition area A1 in which the transistor 101 is disposed in plan view of the semiconductor substrate 301; and the bump 202 disposed so as to overlap the disposition area A2 in which the transistor 112 is disposed in the plan view.

Accordingly, in the case of mounting the power amplifier circuit 10 on the substrate by flip-chip connection, a thermal stress resulting from an external temperature is applied to the transistor 101 and the transistor 112 through the bump 201 and the bump 202.

The application of the thermal stress to the transistor 101 causes a variation in the base-emitter voltage of the transistor 101 and a variation in the operation point of the transistor 101. The application of the thermal stress to the transistor 112 makes it possible to vary the operation point of the transistor 112, as well as the operation point of the transistor 101.

The variation in the operation point of the transistor 112 causes a variation in the current I2. The variation in the current I2 causes a variation in the current I1 to be supplied to the base of the transistor 111. The variation in the current I1 causes a variation in the bias current Ib to be supplied to the base of the transistor 101. The variation in the bias current Ib causes a variation in the operation point of the transistor 101.

Thus, a variation in the characteristics of the transistor 101 resulting from a thermal stress is compensated for by a variation in the characteristics of the transistor 112 resulting from the application of a thermal stress to the transistor 112. Accordingly, an influence of the thermal stress on the power amplifier circuit 10 can be reduced.

The power amplifier circuit according to the second embodiment includes the second insulating film 322 disposed between the transistor 101 and the bump 201, and the second insulating film 422A disposed between the transistor 112A and the bump 202A. The bump 201 is electrically connected to the emitter of the transistor 101 through the cavity 3221 disposed in the second insulating film 322, and the bump 202A is electrically connected to the emitter of the transistor 112A through the cavity 4221 disposed in the second insulating film 422A.

With this configuration, a stress can be applied more to the transistor 112A. Accordingly, a characteristic variation of each unit transistor of the transistor 101 can be compensated for more appropriately, and thus an influence of a thermal stress on the power amplifier circuit can be reduced more.

In the power amplifier circuit 10, the bump 202 is disposed so as to overlap the emitter of the transistor 112 in plan view of the semiconductor substrate 301. With this configuration, a stress resulting from a thermal stress can be applied to the emitter of the transistor 112 that contributes more to a variation in the characteristics of the transistor 112 resulting from the stress. Accordingly, a variation in the characteristics of each unit transistor of the transistor 101 resulting from the thermal stress can be compensated for more appropriately.

In the power amplifier circuit 10, the bump 201 and the bump 202 have a substantially identical thickness in a direction perpendicular to a principal surface of the semiconductor substrate 301. With this configuration, in the semiconductor device 50 including the power amplifier circuit 10, the states of the stresses applied from the bump 201 and the bump 202 to each unit transistor of the transistor 101 and the transistor 112, respectively, can be made similar to each other. Because the states of the stresses applied to each unit transistor of the transistor 101 and the transistor 112 are similar to each other, a variation in the characteristics of each unit transistor can be compensated for more appropriately.

The semiconductor device 50 includes the semiconductor chip 501 including the power amplifier circuit 10, the module substrate 502 on which the semiconductor chip 501 is mounted, and the resin mold 503 disposed around the semiconductor chip 501. In the semiconductor device 50, compensation can be performed in which a thermal stress resulting from the difference in thermal expansion coefficient between the resin mold 503 and the bumps 201 and 202 is appropriately applied to each unit transistor of the transistor 101 and the transistor 112. As a result of compensating for a characteristic variation resulting from the thermal stress, an influence of the thermal stress on the power amplifier circuit 10 can be reduced.

The power amplifier circuit 70 according to the third embodiment includes the transistor 101 disposed on a semiconductor substrate; the bias circuit 703 configured to be supplied with the control current Ic and to supply the bias current Ib based on the control current Ic to the transistor 101; the bump 201 electrically connected to the emitter of the transistor 101 and disposed so as to overlap the disposition area A1 in which the transistor 101 is disposed in plan view of the semiconductor substrate; the control circuit 702 connected to the bias circuit 703 and configured to supply the control current Ic to the bias circuit 703; the transistor 701 disposed on the semiconductor substrate and having an anode connected to the control circuit 702 and a cathode connected to ground; and the bump 801 disposed so as to overlap the disposition area A3 in which the transistor 701 is disposed in the plan view. The control circuit 702 is configured to detect a characteristic variation of the transistor 701 and supply the control current Ic controlled in accordance with the characteristic variation to the bias circuit 703.

In the case of mounting the power amplifier circuit 70 on the substrate by flip-chip connection, a thermal stress resulting from an external temperature is applied to the transistor 101 and the transistor 701 through the bump 201 and the bump 801.

The application of the thermal stress to the transistor 101 causes a variation in the base-emitter voltage of the transistor 101 and a variation in the operation point of the transistor 101. The operation point of the transistor 701 disposed on the same semiconductor substrate as that for the transistor 101 varies as with the operation point of the transistor 101. The characteristic variation of the transistor 701 resulting from the thermal stress is detected as a change in the forward voltage of the transistor 701 by the control circuit 702. The control circuit 702 supplies the control current Ic to the bias circuit 703 on the basis of the detected characteristic variation.

A variation in the control current Ic causes a variation in the current I1 to be supplied to the base of the transistor 111. The variation in the current I1 causes a variation in the bias current Ib to be supplied to the base of the transistor 101. The variation in the bias current Ib causes a variation in the operation point of the transistor 101.

Thus, the variation in the characteristics of the transistor 101 resulting from the thermal stress is compensated for on the basis of the characteristic variation of the transistor 701 resulting from the thermal stress applied to the transistor 701. Accordingly, an influence of the thermal stress on the power amplifier circuit 70 can be reduced.

The individual embodiments described above are given for facilitating the understanding of the present disclosure and are not for interpreting the present disclosure in a limited manner. The present disclosure can be modified or improved without deviating from the gist thereof, and includes the equivalents thereof. That is, an embodiment obtained by appropriately changing the design of one of the embodiments by a person skilled in the art is included in the scope of the present disclosure as long as the embodiment has a feature of the present disclosure. For example, the individual elements of the individual embodiments, and the dispositions, materials, conditions, shapes, sizes, and so forth thereof are not limited to those described as an example and can be changed as appropriate. Each of the embodiments is merely an example. Obviously, configurations illustrated in different embodiments can be partially replaced or combined, and the replacement or combination is also included in the scope of the present disclosure as long a the replacement or combination has a feature of the present disclosure. The scope of the disclosure is to be determined solely by the following claims.

What is claimed is:

1. A power amplifier circuit comprising:
    a first transistor disposed on a semiconductor substrate;
    a second transistor disposed on the semiconductor substrate and having a base configured to be supplied with a first current which is a first part of a control current, the second transistor being configured to supply a bias current based on the first current to the first transistor;
    a third transistor disposed on the semiconductor substrate and having a collector configured to be supplied with a second current which is a second part of the control current and an emitter configured to output a third current based on the second current;
    a first metal member electrically connected to an emitter of the first transistor, said first metal member being disposed to overlap a first disposition area in which the first transistor is disposed in plan view of the semiconductor substrate; and
    a second metal member disposed to overlap a second disposition area in which the third transistor is disposed in the plan view.

2. The power amplifier circuit according to claim 1, further comprising:
    a first insulating film disposed between the first transistor and the first metal member; and
    a second insulating film disposed between the second transistor and the second metal member, wherein
    the first metal member is electrically connected to the emitter of the first transistor through a first cavity disposed in the first insulating film, and
    the second metal member is electrically connected to an emitter of the second transistor through a second cavity disposed in the second insulating film.

3. The power amplifier circuit according to claim 1, wherein the second metal member is disposed to overlap an emitter of the second transistor in the plan view.

4. The power amplifier circuit according to claim 2, wherein the second metal member is disposed to overlap the emitter of the second transistor in the plan view.

5. The power amplifier circuit according to claim 1, wherein each of the first metal member and the second metal member is a bump.

6. The power amplifier circuit according to claim 2, wherein each of the first metal member and the second metal member is a bump.

7. The power amplifier circuit according to claim 3, wherein each of the first metal member and the second metal member is a bump.

8. The power amplifier circuit according to claim 1, wherein the first metal member and the second metal member have a substantially identical thickness in a direction perpendicular to a principal surface of the semiconductor substrate.

9. The power amplifier circuit according to claim 2, wherein the first metal member and the second metal member have a substantially identical thickness in a direction perpendicular to a principal surface of the semiconductor substrate.

10. The power amplifier circuit according to claim 3, wherein the first metal member and the second metal member have a substantially identical thickness in a direction perpendicular to a principal surface of the semiconductor substrate.

11. A semiconductor device comprising:
    a semiconductor chip including the power amplifier circuit according to claim 1;
    a module substrate on which the semiconductor chip is mounted; and
    a resin mold disposed around the semiconductor chip.

12. A semiconductor device comprising:
    a semiconductor chip including the power amplifier circuit according to claim 2;
    a module substrate on which the semiconductor chip is mounted; and
    a resin mold disposed around the semiconductor chip.

13. A power amplifier circuit comprising:
    a first transistor disposed on a semiconductor substrate;
    a bias circuit configured to be supplied with a control current and to supply a bias current based on the control current to the first transistor;
    a first metal member electrically connected to an emitter of the first transistor, said first metal member being disposed to overlap a first disposition area in which the first transistor is disposed in plan view of the semiconductor substrate;
    a control circuit connected to the bias circuit and configured to supply the control current to the bias circuit;
    a diode disposed on the semiconductor substrate and having an anode connected to the control circuit and a cathode connected to ground; and
    a third metal member disposed to overlap a third disposition area in which the diode is disposed in the plan view, wherein
    the control circuit is configured to detect a characteristic variation of the diode and supply the control current controlled in accordance with the characteristic variation to the bias circuit.

14. The power amplifier circuit according to claim 13, further comprising:
    a first insulating film disposed between the first transistor and the first metal member; and
    a third insulating film disposed between the diode and the third metal member, wherein
    the first metal member is electrically connected to the emitter of the first transistor through a first cavity disposed in the first insulating film, and
    the third metal member is electrically connected to the diode through a third cavity disposed in the third insulating film.

15. The power amplifier circuit according to claim 13, wherein each of the first metal member and the third metal member is a bump.

16. The power amplifier circuit according to claim 14, wherein each of the first metal member and the third metal member is a bump.

17. The power amplifier circuit according to claim 13, wherein the first metal member and the third metal member have a substantially identical thickness in a direction perpendicular to a principal surface of the semiconductor substrate.

18. The power amplifier circuit according to claim 14, wherein the first metal member and the third metal member have a substantially identical thickness in a direction perpendicular to a principal surface of the semiconductor substrate.

19. A semiconductor device comprising:
a semiconductor chip including the power amplifier circuit according to claim 13;
a module substrate on which the semiconductor chip is mounted; and
a resin mold disposed around the semiconductor chip.

20. A semiconductor device comprising:
a semiconductor chip including the power amplifier circuit according to claim 14;
a module substrate on which the semiconductor chip is mounted; and
a resin mold disposed around the semiconductor chip.

* * * * *